United States Patent
Mathew

(10) Patent No.: US 7,880,310 B2
(45) Date of Patent: Feb. 1, 2011

(54) DIRECT DEVICE ATTACHMENT ON DUAL-MODE WIREBOND DIE

(75) Inventor: Ranjan J. Mathew, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 589 days.

(21) Appl. No.: 11/863,346

(22) Filed: Sep. 28, 2007

(65) Prior Publication Data

US 2009/0085201 A1 Apr. 2, 2009

(51) Int. Cl.
*H01L 23/48* (2006.01)
*H01L 23/52* (2006.01)

(52) U.S. Cl. .............. 257/777; 257/686; 257/784; 257/E23.169; 257/774

(58) Field of Classification Search .......... 257/777, 257/686, 723, 778, E23.169
See application file for complete search history.

(56) References Cited

U.S. PATENT DOCUMENTS

| | | | |
|---|---|---|---|
| 5,239,448 A * | 8/1993 | Perkins et al. ............ 361/764 |
| 5,399,898 A * | 3/1995 | Rostoker .................... 257/499 |
| 6,410,990 B2 | 6/2002 | Taylor et al. |
| 6,717,251 B2 * | 4/2004 | Matsuo et al. ............. 257/686 |
| 6,927,156 B2 | 8/2005 | Matthew |
| 7,045,886 B2 * | 5/2006 | Sawada ..................... 257/686 |
| 7,071,566 B2 * | 7/2006 | Cole et al. ................. 257/777 |
| 7,224,051 B2 * | 5/2007 | Farnworth et al. ......... 257/678 |
| 7,491,582 B2 * | 2/2009 | Yokoyama et al. ......... 438/109 |
| 7,498,675 B2 * | 3/2009 | Farnworth et al. ......... 257/723 |
| 2005/0170600 A1 * | 8/2005 | Fukuzo ..................... 438/396 |
| 2006/0065963 A1 | 3/2006 | Low et al. |
| 2007/0145607 A1 * | 6/2007 | Mathew ..................... 257/784 |
| 2008/0036082 A1 * | 2/2008 | Eun ........................... 257/737 |

OTHER PUBLICATIONS

2006 Electronics and Component Conference, 1386. "Wirebond, Flip-Chip and Chip-Scale-Package Solution to High Silicon Integration", By Ely Bantog, Steve Chiu, C.T. Chen H.P.Pu, and C.S Hsiao.

* cited by examiner

*Primary Examiner*—Nitin Parekh
(74) *Attorney, Agent, or Firm*—Cool Patent, P.C.; Joseph P. Curtin

(57) ABSTRACT

A dual-mode integrated circuit comprises wirebondable and solderable electrical connectors.

12 Claims, 3 Drawing Sheets

DIRECT DEVICE ATTACHMENT ON DUAL-MODE WIREBOND DIE

BACKGROUND

Bare electronic chips typically need to be housed in a package that provides an electrical connection between each external electrical contact on the chip to an external electrical contact or terminal of the package, such as, a package connector, pin or ball that allows electrical connection of the package to further external circuitry, such as a printed circuit board. Electrical contacts or pads situated on the top face of the chip typically facilitate electrical continuity between the circuit side of the interior of the chip to the external packaging connections of the chip. Electrical continuity between the pads on the top face of the chip to the package terminals is enabled through interconnect technology, such as wirebond or flip-chip.

A package may have a non-conductive substrate (such as a plastic film or layer) with conductive traces (wires) on or in a surface of the substrate. Typically, either flip-chip connections or wirebond may connect a chip to the package. Some packages include multiple chips, such as one or more logic or processor chips, one or more communications chips (such as for a cell phone or wireless LAN), and/or one or more memory chips, such as a FLASH-type reprogrammable non-volatile memory. Optionally, a cover or encapsulant is used to enclose the chip or chips.

Wirebond packages and flip-chip packages may be used to package one or more integrated circuit (IC) die. In a wirebond package, an upper surface of a wirebond die is coupled to an upper surface of a wirebond package substrate. The chip or die bottom surface or face, opposite to the die top face with the electrical contacts, is first attached to the top face of a wirebond substrate and then connected to the package by fine wires to electrically connect the contacts or pads at the top face of the wirebond die to corresponding electrical contacts of the top face of the wirebond package substrate. In contrast, in a flip-chip package, the chip or die is first inverted or flipped such that the top face of the die faces corresponding contacts on the top face of the substrate and electrical continuity between the die and the substrate is achieved through electrical interconnects, such as solder or copper bumps, to connect the top face of a flip-chip die to the top face of the substrate.

DETAILED DESCRIPTION

Figure 1:
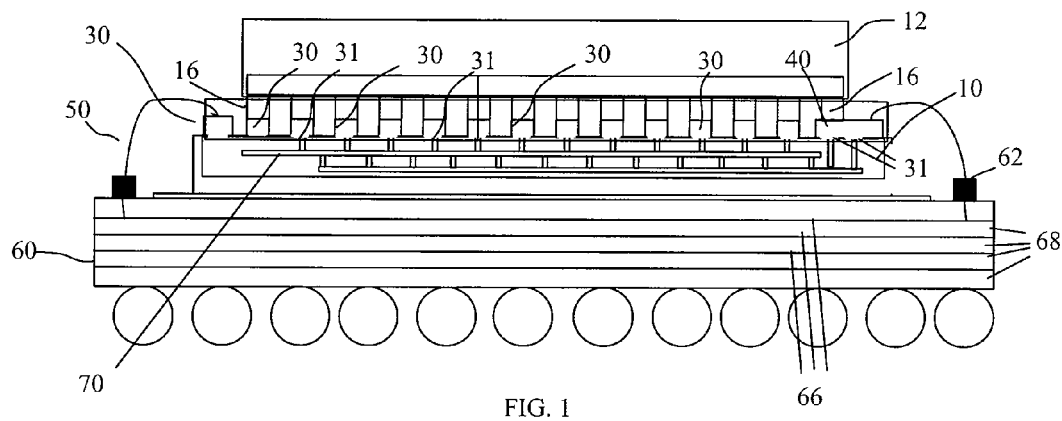
FIG. 1 is a cross-sectional side view of a particular embodiment of a dual-mode die package and flip-chip package stack.

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

The terms chip, die, integrated circuit, and microelectronic device, are used interchangeably in this description. In this description, the term solder, solder bumps and solderable applies both to substantially pure single metallic elements and to alloys or combinations of two or more elements, at least one of which is a metallic element. The term substrate, interposer or core generally refers to the physical that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a core sheet or piece of material (such as iron-nickel alloy) chosen for its a coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally, and vias that carry signals and electrical power vertically between layers of traces. The term solder resist generally refers to substantially homogeneous or heterogeneous non-metallic, non-electrically conductive elements or materials on the surface of the substrate. The term solder flux generally refers to substantially homogeneous or heterogeneous materials used to facilitate the joining or connection between two metal surfaces. The term prefluxing generally refers to applying solder flux between either one or both metal surfaces before they are joined. The term reflow generally refers to applying thermal stress and melting either one or both metal surfaces to achieve the joint between them. The term defluxing generally refers to removing substantially homogeneous or heterogeneous materials used to facilitate the connection between two metal surfaces. The term passivation generally refers to substantially homogeneous or heterogeneous non-metallic, non-electrically conductive elements or materials on the surface of the die. The term micropassivation generally refers to substantially homogeneous or heterogeneous non-metallic, non-electrically conductive elements or materials on the surface of the die that are substantially thinner than normal passivation. The term silicon through vias is defined to mean conductive openings through the thickness of the silicon connecting the front surface of a flip-chip or dual-mode die to the opposite or bottom side of the dual-mode or flip-chip die. The term vertical is defined to mean substantially perpendicular to the major surface of a substrate. Height or depth refers to a distance in a direction perpendicular to the major surface of a substrate. The term stacking is defined to mean physically locating directly above or substantially perpendicular to the major surface of a die or substrate. The terms metal, metal line, trace, wire, conductor, signal path and signaling medium are all related. The related terms listed above, are generally interchangeable, and appear in order from specific to general.

In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials, such as doped polysilicon, doped single-crystal silicon (often referred to simply as diffusion, regardless of whether such doping is achieved by thermal diffusion or ion implantation), titanium (Ti), molybdenum (Mo), and refractory metal silicides, are examples of other conductors. The term wafer level is defined to mean substantially processing several die in fabrication on a single wafer. The term sort is defined to mean a sequence in wafer level fabrication to test the quality of individual die on a wafer. The term singulation or die preparation is defined to mean an excising an individual die from a wafer after wafer level fabrication.

Various stacking arrangements may be used to vertically stack and interconnect multiple wirebond die and separately to vertically stack and interconnect flip-chip die or to vertically stack and interconnect both wirebond and flip-chip die to achieve three dimensional (3D) packaging to improve chip to package interconnection density where space is limited (for example, in cell phones or flash cards or USB memory sticks and/or other consumer electronic devices). Typical arrangements include: several wirebond die stacked vertically with or without spacers, a wirebond die stacked above a flip-chip die, a flip-chip die stacked vertically above another flip-chip die using through silicon vias and package-on-package (PoP), such as an assembled flip-chip package placed above an assembled wirebond package in which the top flip-chip package is connected to a bottom wirebond die through another substrate or interposer.

FIG. 1 is a side view of a particular embodiment of a flip-chip die 12 vertically stacked above a wirebondable dual-mode die 10 without an intervening substrate, interposer or silicon through vias. In a particular embodiment, dual-mode die 10 may comprise both wirebondable and flip-chip solderable electrical connectors and may be capable of bonding by wires as well as flip-chip solder balls/bumps. Such wirebondable and flip-chip solderable electrical connectors may be conductive pillars 30 and/or conductive elements 40. According to a particular embodiment, a variety of flip-chip die 12 to dual-mode die 10 stacked die arrangements may be made. Such arrangements may combine different silicon-process generations and circuits, such as analog, digital logic and memory silicon technology. Dual-mode die 10 may enable reduced assembly steps for system-in-a-package (SIP) assembly, by mating flip-chip silicon directly to wirebondable silicon and potentially avoiding a separate underfill step for the flip-chip silicon. Such a direct connection may substantially overcome problems related to the differences in relative thermal expansion coefficients between silicon and the substrate to which flip-chip die 10 may normally be attached. In a particular embodiment, the entire dual-mode die 10 to flip-chip die 12 assembly may be subsequently overmolded in one step for packaging. Attaching flip-chip die 12 directly to dual-mode die 10 may reduce the thermal-dissipation path between the two die and enable better heat conduction through the silicon either to the bottom or the top of the package (not shown). However, this is merely an example of a method of vertically stacking a flip-chip die directly above a dual-mode die and claimed subject matter is not so limited.

According to a particular embodiment, dual-mode die 10 may comprise one or more conductive pillars 30 capable of being bonded with one or more wires 50 and/or bonding to one or more solderable bumps 16 of flip-chip die 12. In a particular embodiment, conductive pillars 30 may comprise metal-defined or "solder-resist" defined geometries. In a particular embodiment, conductive pillars 30 may be formed by passivating a copper-metallization layer with micropassivation. Defining solder-resist openings in a inicropassivation layer may be accomplished using conventional wafer-level photoimaging and etching methods. However, this is merely an example of a method of fabricating conductive pillars and claimed subject matter is not so limited.

In a particular embodiment, flip-chip die 12 may be stacked directly above dual-mode die 10. Such stacking of flip-chip die 12 directly above dual-mode die 10 may be arranged without inserting an interposer between dual-mode die 10 and flip-chip die 12. According to a particular embodiment, this arrangement may achieve interconnectivity between the top surface of flip-chip die 12 to the top surface of a dual-mode die 10 without the use of silicon through vias.

Figure 4:
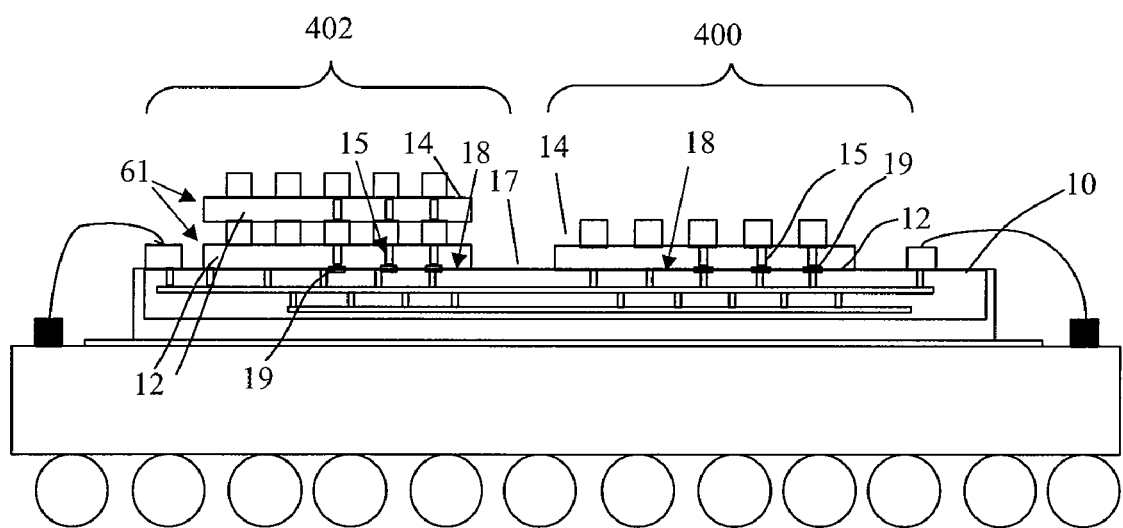
FIG. 4 is a cross-sectional side view of a particular embodiment of a dual-mode die and multiple flip-chip die stack.

FIG. 4 illustrates two alternative die-stacking arrangements on a single dual-mode die 10. In a first die-stacking arrangement 400, in a particular embodiment, flip-chip die 12 may be stacked vertically above dual-mode die 10, such that the top face 14 of flip-chip die 12 faces away from top face 17 of dual-mode die 10. Hence, bottom face 18 of flip-chip die 12 may face top face 17 of dual-mode die 10. According to a particular embodiment, interconnectivity may be achieved by through-silicon vias 15. Such through-silicon vias 15 may extend from top face 14 of flip-chip die 12 to bottom face 18 of flip-chip die 12 and may be connected to corresponding solderable pads 19 of dual-mode die 10.

In a second die-stacking arrangement 402, in a particular embodiment, vertically stacked flip-chip die 12 may be interconnected by through silicon vias 15 and may be positioned directly above dual-mode die 10. Through-silicon vias 15 in bottom face 18 of the bottom most flip-chip die 12 in the flip-chip die stack δ 1 may be connected to solderable pads 19 on top face 17 of dual-mode die 10 to interconnect flip-chip die stack 61 and dual-mode die 10. In a particular embodiment, stacking flip-chip die directly over dual-mode die 10 may reduce the overall height of such a multi-chip assembly. However, these are merely examples of methods of stacking one or more flip-chip die directly above a dual-mode die and claimed subject matter is not so limited.

Returning to FIG. 1, in a particular embodiment, flip-chip die 12 may be connected to dual-mode die 10 via one or more copper pillars 30 by prefluxing solder bumps 16 either on flip-chip die 12 or dual-mode die 10 or both. In a particular embodiment, conventional fluxing, reflow and defluxing methods for bonding surface mount and flip-chip die attach may be re-used in an assembly process. Alternatively, the dual-mode die 10 may be prefluxed by printing or spraying prior to attachment of the flip-chip die 12. However, this is merely an example of a method of assembling a flip-chip die directly above a dual-mode die and claimed subject matter is not so limited.

In a particular embodiment, flip-chip die 12 may be attached to dual-mode die 10 prior to sort, singulation/die preparation. In a particular embodiment, attaching one or more flip-chip die 12 to dual-mode die 10 may enable a "known good" pre-assembly test strategy or module because the dual-mode die 10 may have exposed test sites accessible during assembly. Such test sites may include any exposed copper pillars used for wirebonding on the periphery of dual-mode die 10. Such an assembly may be pre-tested prior to subsequent packaging to improve yields or reworkability. However, this is merely an example of a "known good" pre-assembly test strategy or module and claimed subject matter is not so limited.

Referring still to FIG. 1, according to a particular embodiment, dual-mode die 10 and flip-chip die 12 may comprise integrated electrical devices (not shown) capable of providing microprocessor functionality and may be fabricated using any suitable materials and fabrication techniques. In a particular embodiment, dual-mode die 10 may define a plurality of apertures 31. According to a particular embodiment, at least one of conductive elements 40 may be disposed on and/or in one or more of the plurality of apertures 31 and may be electrically connected to a first electrical conductor via the one or more apertures 31. In a particular embodiment, conductive elements 40 are positioned on a top surface of dual-mode die 10 and may have a portion of the conductive element 40 substantially within one or more of apertures 31. In a particular embodiment, one or more conductive pillars 30 may be disposed on and/or in one or more of the plurality of apertures 31 and may be electrically connected to a second electrical conductor through apertures 31. In a particular embodiment, one conductive pillar 30 may be positioned on a top surface of dual-mode die 10 and may have a portion of the one conductive pillar 30 substantially within an aperture 31.

In a particular embodiment, electrical devices of dual-mode die 10 and flip-chip die 12 may be-electrically connected to one or more conductive pillars 30 and/or conductive elements 40. According to a particular embodiment, the electrical devices of dual-mode die 10 and flip-chip die 12 may therefore also be connected to wires 50 and/or solder bumps 16 via pillars 30 and elements 40. In a particular embodiment, wires 50 and/or solder bumps 16 connected to conductive pillars 30 may carry input/output (110) signals and wires 50 and/or solder bumps 16 connected to conductive elements 40 carry power or ground signals. In a particular embodiment, power delivery grids 70 may be capable of delivering power and ground signals to electrical devices of dual-mode die 10 and flip-chip die 12.

In a particular embodiment, connections from dual-mode die 10 to flip-chip die 12 may be made via one or more wires 50 and/or conductive pillars 30 either through the underlying dual-mode die 10 circuitry and power grid 70 or through conductive elements 40 on the surface of dual-mode die 10. Conductive pillars 30 in dual-mode die 10 may be connected directly to underlying die circuitry and power grid 70 through predefined passivation openings (not shown) and/or a circuit (not shown) comprising the same surface copper metallization used to create conductive pillars 30. In a particular embodiment, copper pillars 30 may be connected to peripheral wirebond pads and/or solder bumps 16 either via one or more conductive elements 40 or via metal layers of power grid 70 or a combination of the two. Such connection may enable flip-chip die 12 to share the same power and ground rails 70 with dual-mode die 10. In a particular embodiment, power-delivery grids 70 may be composed of any suitable material, such as, for instance, 1 μm thick copper and/or aluminum within the internal circuitry of dual-mode die 10. Alternatively, this circuit created by the surface conductive elements 40 could also be used to interconnect portions of the flip-chip die that are not normally connected internally to create new product variation by interconnecting, disabling or enabling product feature sets by external connections between pads of the flip chip die. An example would be if there is a need to connect a dedicated set of I/O on the east side of the flip-chip silicon to another set of I/O on the west side as a fusing or binning option to enable a unique feature set at the original equipment manufacturer or customer site, then the electrical connection is made through the surface circuitry 40 on the dual-mode die instead of through the flip-chip silicon internal circuitry. However, this is merely an example of a method of providing electrical interconnections between dual-mode die and flip-chip die and claimed subject matter is not so limited.

FIG. 1 illustrates dual-mode die 10 coupled to substrate 60. In a particular embodiment, substrate 60 may comprise dielectric layers 68 with conductive materials 66 fabricated thereon. The dielectric layers 68 may be composed of any suitable material, including but not limited to bismaleimide triazine (BT) and FR4 in some embodiments. The conductive layers may comprise reference planes for supplying reference voltages to electrical components that may be connected to substrate 60, or routing layers including conductive traces for carrying electrical signals between such electrical components. In a particular embodiment, substrate 60 includes contacts 62 to electrically connect wires 50 to the conductive layers. However, this is merely an example of an IC package substrate layout and claimed subject matter is not so limited.

Figure 2:
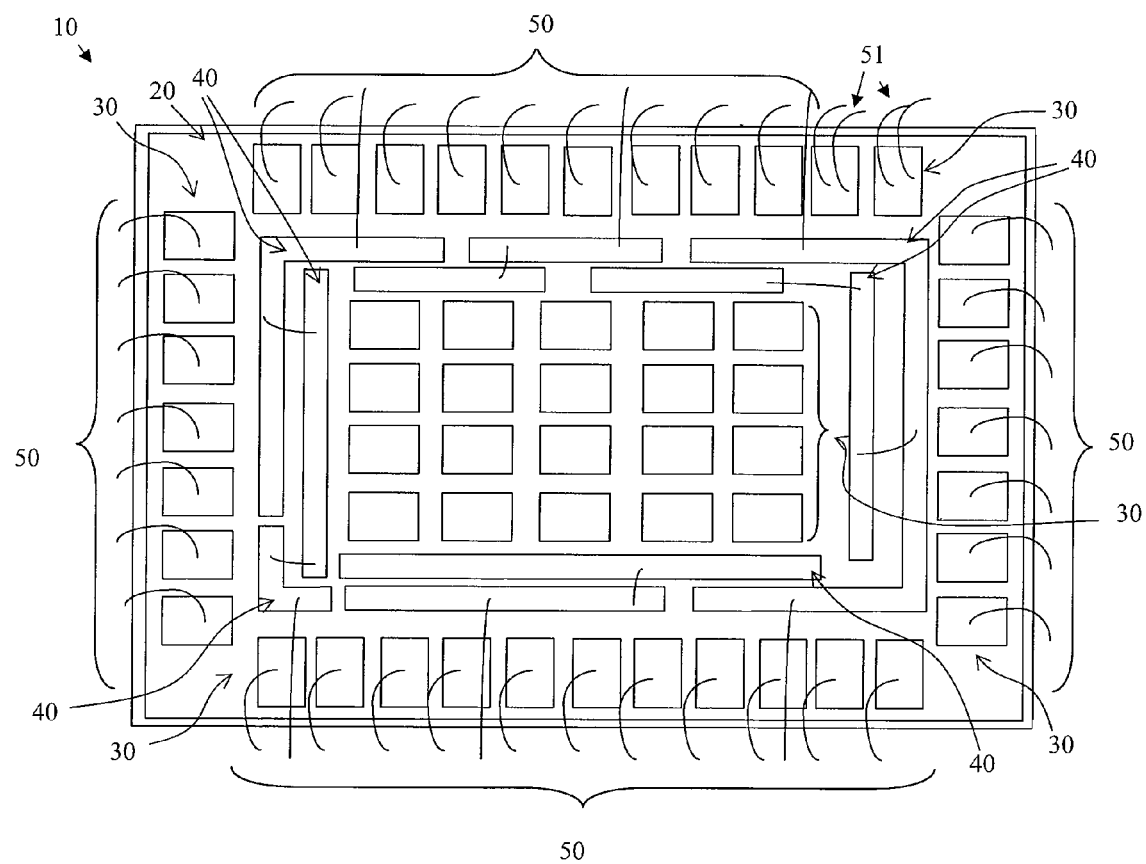
FIG. 2 is a plan view of a particular embodiment of a dual-mode die.

FIG. 2 is a plan view of dual-mode die 10 according to a particular embodiment. Dual-mode die 10 may comprise conductive pillars 30, conductive elements 40 disposed thereon, and wires 50 bonded to one or more conductive pillars 30 and/or conductive elements 40. In a particular embodiment, two wires 50 may be connected to a single conductive pillar 30 (illustrated with element 51). These two wires 51 are asymmetric according to some embodiments. Connecting two or more asymmetric wires to a pillar 30 may reduce a wire-resistance-based voltage drop between package substrate 60 and the pillar 30 in comparison to single-wire arrangements, and may also reduce crosstalk between two wires 51. Alternatively, referring again to FIG. 1, solder bump 16 may be coupled to conductive element 40 and a wire 50 may also be connected to the same conductive element. This may reduce a resistance-based voltage drop between package substrate 60 and the inner most sections of either flip-chip die 12 or the dual-mode die 10. This is achieved by channeling any direct or return-path currents through the conductive elements 40 instead of solely relying on the inner power or ground circuitry and rails 70 embedded in the dual-mode die or the flip-chip die to distribute current profiles from the periphery to the center of either flip-chip or the dual-mode die. A greater current may be channeled though conductive elements 40 rather than the embedded circuitry in the silicon 70 because conductive element 40 may typically be 50 to 100 times thicker than the internal circuitry malting up power grid 70. In one embodiment the internal circuitry metallization may be 1.0 μm thick whereas the metal thickness of the surface conductive element 40 may be 60.0 μm, for instance. However, this is merely an example of a method of reducing a resistance-based voltage drop between the periphery and the interior portions of either flip-chip or dual-mode die and claimed subject matter is not so limited.

In a particular embodiment, conductive pillars 30 and conductive elements 40 may comprise copper or any other conductive wire-bondable material. According to a particular embodiment, conductive pillars 30 and conductive elements 40 may be fabricated using any suitable techniques that are or become known. According to a particular embodiment, conductive pillars 30 and conductive elements 40 may be fabricated simultaneously using a copper-electrode-position process along with established standard photolithographic-masking techniques. However, these are merely examples of materials and methods for fabricating conductive pillars and conductive elements and claimed subject matter is not so limited.

Returning to FIG. 2, many different layouts of conductive elements 40 and/or copper pillars 30 may be used in conjunction with some embodiments. Additionally or alternatively, various embodiments may utilize many different wire-bonding patterns. In a particular embodiment, wires 50 and/or solder bumps 16 (as shown in FIG. 1) may be bonded to conductive pillars 30 and may carry 110 signals, while wires 50 and/or solder bumps 16 bonded to conductive elements 40 may carry power and ground signals. As shown, some wires 50 are used to directly connect two conductive elements 40. Such wires may reduce a voltage drop in dual-mode die 10. However, this is merely an example of a particular layout of conductive elements and copper pillars and claimed subject matter is not so limited.

Figure 3:
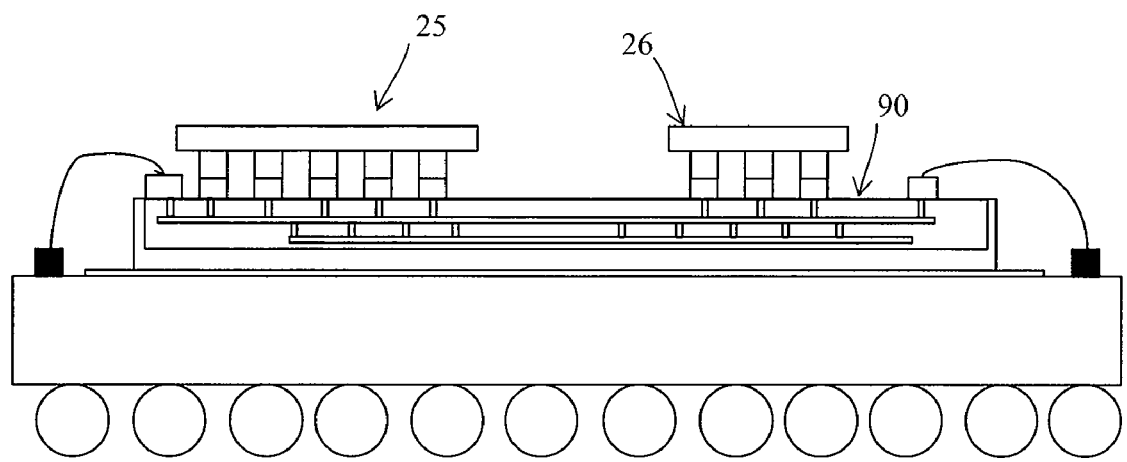
FIG. 3 is a cross-sectional side view of a particular embodiment of a dual-mode die and multiple flip-chip die stacked.

In a particular embodiment, mixed device and interconnect stackability may be enabled by locating and attaching multiple flip-chip die or surface mount components, such as dual-terminal (2T) discrete resistors, inductors or capacitors, voltage regulators, low pin-count chip-scale or wafer-level devices above a dual-mode die. FIG. 3 illustrates an assembly 300 comprising dual-mode die 90 interconnected with flip-chip die 25 and passive device 26. However, this is merely an example of a method of connecting multiple devices above a dual-mode die and claimed subject matter is not so limited.

Figure 5:
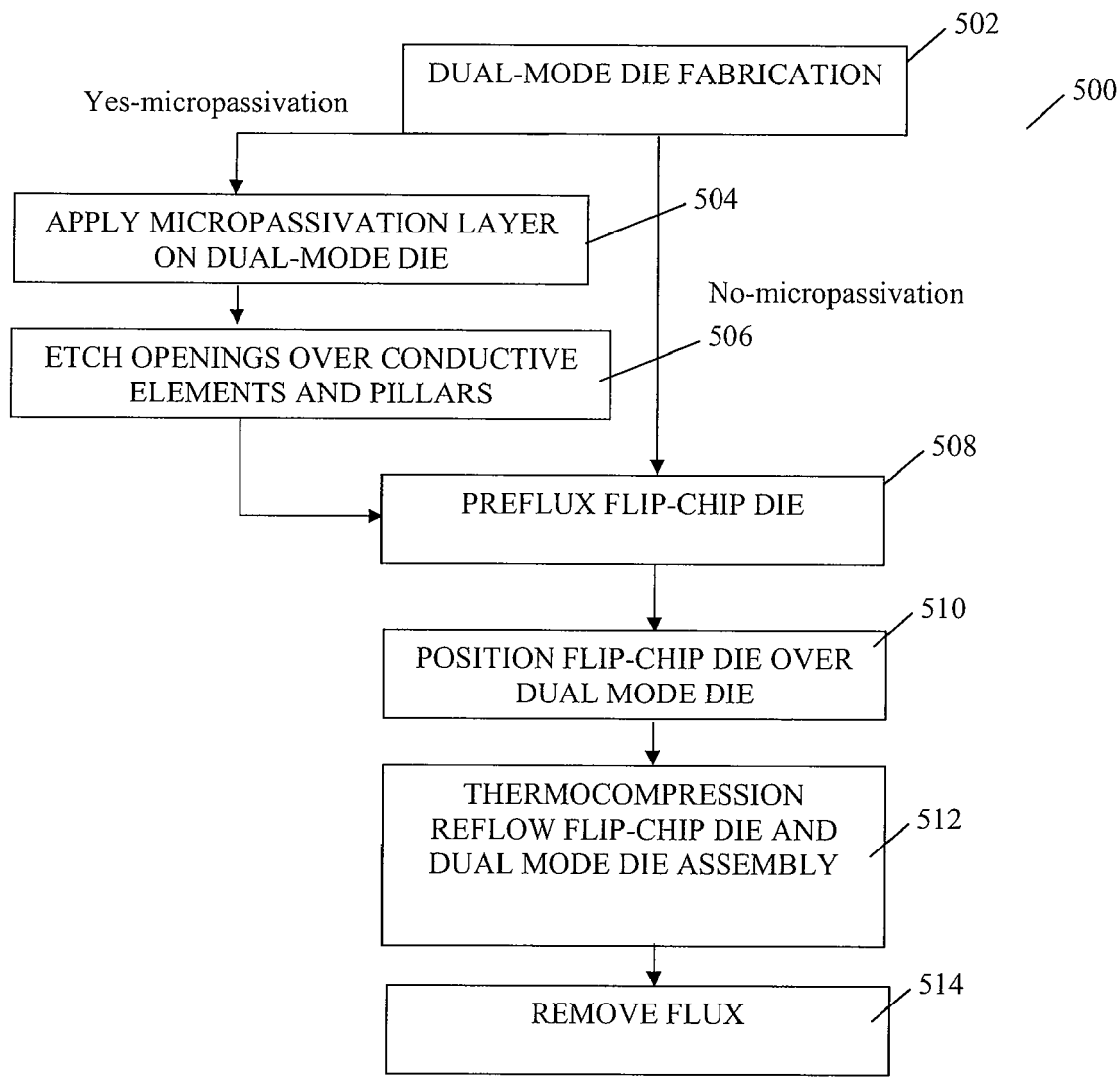
FIG. 5 is a block diagram of a particular embodiment of a process for assembling a flip-chip die over a dual-mode die.

FIG. 5 is a flow diagram illustrating a particular embodiment of an assembly process 500 for assembling a flip-chip die above a dual-mode die without a separate underfill step. In a particular embodiment, at processing step 502 a dual-mode die comprising copper pillars and conductive elements may be fabricated with or without a micropassivation layer. If a micropassivation layer is used, the process flows to processing step 504, where dual-mode die is blanketed with a layer of micropassivation. At processing step 506 openings are made only in those sections of the copper pillars or conductive elements where corresponding connections will need to be made to the flip-chip die. This approach allows the electrical interconnection between the two die while providing electrical insulation between adjacent surface circuit elements 40 or pillars 30 in the dual-mode die. In a particular embodiment, the process flows to processing step 508, where a flip-chip die may be prefluxed with an appropriate water-soluble and/or no-clean flux. At processing step 510, the flip-chip die may be positioned directly above the dual-mode die. At processing step 512 the dual-mode die and flip-chip die may be thermocompression reflowed. At processing step 514, after reflow, if a water-soluble flux was used, the remnant flux may be removed by aqueous treatment. If no-clean flux is used remnant flux may remain. However, this is merely an example of a process for assembling a flip-chip die above a dual-mode die and claimed subject matter is not so limited. For instance, in a particular embodiment assembly may involve one or more flip-chip die and/or other devices as discussed above.

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the spirit of claimed subject matter.

What is claimed is:

1. An apparatus, comprising:
    a dual-mode integrated circuit having a plurality of apertures and comprising a plurality of electrical connectors, the electrical connectors being: wirebondable or solderable, or combinations thereof; and
    wherein the plurality of electrical connectors comprise: a plurality of first and second electrical conductors:
        one or more conductive pillars in the dual-mode integrated circuit disposed directly above the plurality of apertures, the conductive pillars electrically connected to the plurality of second electrical conductors through the respective apertures,
    wherein the plurality of second electrical conductors are is substantially centrally disposed on a top surface of the dual-mode integrated circuit and wherein the plurality of first electrical conductors are substantially disposed on a periphery of the top surface of the dual-mode integrated circuit and wherein one or more electronic devices being electrically connected to the dual-mode integrated circuit via electrical contacts bonded to the plurality of second electrical conductors and a plurality of wires are coupled to the plurality of first electrical conductors and respective electrical contacts on a package substrate.

2. The apparatus of claim 1 further comprising one or more electronic devices electrically connected to the dual-mode integrated circuit via one or more soldered contacts bonded to one or more of the electrical connectors.

3. The apparatus of claim 2 wherein one or more of the electronic devices comprises: a flip-chip integrated circuit, a passive device or an analog device, or combinations thereof.

4. The apparatus of claim 2 wherein the dual-mode integrated circuit further comprises;
    a power grid comprising power and ground metal layers, the power grid electrically coupled to one or more electronic devices via at least one of the electrical connectors.

5. The apparatus of claim 2 further comprising a surface layer circuit capable of interconnecting one or more electronic devices to the dual-mode integrated circuit.

6. The apparatus of claim 1 further comprising two or more electronic devices stacked vertically above the dual-mode die, the electronic devices being electrically connected to each other via silicon through hole vias and wherein a bottommost electronic device is further electrically coupled to the dual-mode integrated circuit via one or more soldered contacts bonded to one or more of the electrical connectors.

7. The apparatus of claim 6 wherein one or more of the electronic devices comprises: a flip-chip integrated circuit, a passive device or an analog device, or combinations thereof.

8. The apparatus according to claim 1, wherein the one or more conductive pillars are formed from copper.

9. The apparatus of claim 8, further comprising one or more electronic devices electrically connected to the dual-mode integrated circuit via one or more soldered contacts bonded to one or more of the electrical connectors.

10. The apparatus of claim 9, wherein the dual-mode integrated circuit further comprises;
    a power grid comprising power and ground metal layers, the power grid electrically coupled to one or more electronic devices via at least one of the electrical connectors.

11. The apparatus of claim 9, wherein one or more of the electronic devices comprises: a flip-chip integrated circuit, a passive device or an analog device, or combinations thereof.

12. The apparatus of claim 8, further comprising two or more electronic devices stacked vertically above the dual-mode die, the electronic devices being electrically connected to each other via silicon through hole vias, and wherein a bottommost electronic device is further electrically coupled to the dual-mode integrated circuit via one or more soldered contacts bonded to one or more of the electrical connectors.

* * * * *

UNITED STATES PATENT AND TRADEMARK OFFICE
CERTIFICATE OF CORRECTION

| | | |
|---|---|---|
| PATENT NO. | : 7,880,310 B2 | |
| APPLICATION NO. | : 11/863346 | |
| DATED | : February 1, 2011 | |
| INVENTOR(S) | : Ranjan J Mathew | |

It is certified that error appears in the above-identified patent and that said Letters Patent is hereby corrected as shown below:

In column 8, line 4, in Claim 1, after "are" delete "is".

Signed and Sealed this
Tenth Day of May, 2011

David J. Kappos
*Director of the United States Patent and Trademark Office*